(12) United States Patent
Kamatani

(10) Patent No.: US 8,755,419 B2
(45) Date of Patent: Jun. 17, 2014

(54) LASER DIODE DRIVE CIRCUIT

(75) Inventor: Tomohiko Kamatani, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 226 days.

(21) Appl. No.: 12/868,182

(22) Filed: Aug. 25, 2010

(65) Prior Publication Data

US 2011/0051764 A1   Mar. 3, 2011

(30) Foreign Application Priority Data

Sep. 2, 2009   (JP) ................. 2009-202473

(51) Int. Cl.
*H01S 3/00* (2006.01)
*H01S 5/00* (2006.01)

(52) U.S. Cl.
USPC .............. 372/38.04; 372/38.01; 372/38.02; 372/38.07

(58) Field of Classification Search
None
See application file for complete search history.

(56) References Cited

U.S. PATENT DOCUMENTS

| | | | | |
|---|---|---|---|---|
| 6,822,987 | B2 * | 11/2004 | Diaz et al. .................. | 372/38.02 |
| 7,573,922 | B2 | 8/2009 | Kamatani et al. | |
| 7,679,296 | B2 | 3/2010 | Kamatani | |
| 7,693,196 | B2 | 4/2010 | Kamatani et al. | |
| 2007/0273681 | A1 * | 11/2007 | Mayell .......................... | 345/211 |
| 2008/0278098 | A1 * | 11/2008 | Kamatani ..................... | 327/108 |
| 2009/0141762 | A1 | 6/2009 | Kamatani | |
| 2010/0142336 | A1 * | 6/2010 | Ishibashi et al. .............. | 369/47.5 |

FOREIGN PATENT DOCUMENTS

| | | |
|---|---|---|
| JP | 6-139607 | 5/1994 |
| JP | 11-213426 | 8/1999 |
| JP | 3280111 | 2/2002 |
| JP | 2003-101129 | 4/2003 |
| JP | 2005-209968 | 8/2005 |
| JP | 2006-185997 | 7/2006 |
| JP | 2007-73543 | 3/2007 |
| JP | 2007-210238 | 8/2007 |
| JP | 2007-318983 | 12/2007 |
| JP | 2007-334972 | 12/2007 |
| JP | 2008-276843 | 11/2008 |
| JP | 2008-283033 | 11/2008 |
| JP | 2009-135281 | 6/2009 |
| JP | 2009-164193 | 7/2009 |
| JP | 2010-123715 | 6/2010 |
| JP | 2010-157572 | 7/2010 |
| JP | 2010-157573 | 7/2010 |
| WO | WO2006/090740 | 8/2006 |
| WO | WO2006/137303 | 12/2006 |

* cited by examiner

*Primary Examiner* — Armando Rodriguez
*Assistant Examiner* — Sean Hagan
(74) *Attorney, Agent, or Firm* — Cooper & Dunham LLP

(57) ABSTRACT

A laser diode drive circuit includes a power supply circuit connected to an anode of a laser diode to supply a variable voltage to the laser diode, and a drive current control circuit connected to a cathode of the laser diode to control a current of the laser diode. The power supply circuit generates a start-up voltage which is equal to the sum of the maximum drive voltage that is larger than the drive voltage and a predetermined first reference voltage, acquires a cathode voltage of the laser diode while the start-up voltage is generated, generates a voltage by lowering from the start-up voltage so as to diminish the difference between the acquired cathode voltage and the first reference voltage, and the first reference voltage is the minimum cathode voltage necessary to supply a predetermined current to the laser diode by the drive current control circuit.

12 Claims, 8 Drawing Sheets

LASER DIODE DRIVE CIRCUIT

TECHNICAL FIELD

The present disclosure relates to a laser diode drive circuit, and more particularly, to a laser diode drive circuit having low power consumption and capable of quick start up.

BACKGROUND ART

Recently, laser diodes have come to be widely used in a variety of types of electrical equipment, for example, laser printers, optical disk apparatuses, fiber-optic communication apparatuses, and mobile phones, because of their compact size, low power requirements, and long life.

FIG. 1 is a schematic block diagram of a generally known laser diode drive circuit. The laser diode drive circuit generally includes a drive current control circuit 10 and a power supply circuit 20. The power supply circuit 20 is connected to a Vdd power supply source. The output terminal Vout of the power supply circuit 20 is connected to an anode of the laser diode LD. The power supply circuit 20 supplies power to the laser diode LD by generating an output voltage Vo at the output terminal Vout.

The drive current control circuit 10 is connected to a cathode of the laser diode LD through an output terminal thereof. The drive current control circuit 10 receives an image data signal (video signal) DATA and switches the laser diode LD on and off according to the image data signal DATA. The drive current control circuit 10 supplies a predetermined constant current to the laser diode LD to light the laser diode LD.

There is a large fluctuation in drive voltage Vop of the laser diode LD due to variation arising during the manufacturing process of the laser diode LD. For example, the drive voltage Vop of the blue laser diode may vary from 3.5 v to 5 v or more. Accordingly, the output voltage Vo of the power supply circuit 20 must be set to a voltage greater than the contemplated drive voltage to be used in consideration of these fluctuations in the drive voltage Vop of the laser diode LD. More specifically, it is necessary that the output voltage Vo is set to a larger voltage than the maximum drive voltage Vopmax (hereinafter simply "maximum drive voltage").

When a drive current is supplied to the laser diode, a LD terminal voltage Vdr is generated at the LD terminal. The LD terminal voltage Vdr is the voltage at the output terminal of the drive current control circuit 10 to which the cathode of the laser diode is connected. The LD terminal voltage Vdr is a voltage obtained by subtracting the Vop that is the drive voltage of the laser diode from the output voltage Vo of the power supply circuit 20. Consequently, the output voltage Vo of the power supply circuit 20 is set to a voltage higher than a voltage obtained by adding the LD output terminal voltage Vdr to the maximum drive voltage Vopmax.

However, when the output voltage Vo of the power supply circuit 20 is set to a voltage which is the sum of the maximum drive voltage Vopmax and the LD output terminal voltage Vdr as described above, a difference between the actual drive voltage Vop and the maximum drive voltage Vopmax may be consumed as unnecessarily, resulting in wasted power consumption. For example, when a drive current is set to 0.1 A and the maximum drive voltage Vopmax is set to 6 v, and the actual drive voltage of the laser diode LD is 4 v, the difference between the actual drive voltage and the maximum drive voltage Vopmax, i.e., 2 v, is added to the LD output terminal voltage Vdr. Accordingly, since the drive current is 0.1 A, the drive current control circuit 10 consumes 0.2 w of power needlessly.

In addition, recent remarkable developments in low power technology has reduced power supply voltages Vdd significantly, and the power supply voltage for the most apparatuses is now 3.3 v or 5 v. However, such voltage is not enough to drive blue laser diodes, which need a high drive voltage Vop. Accordingly, it is necessary to boost the power supply voltage with the power supply circuit 20. For this reason, it is necessary that the power supply circuit 20 employ a boost-type switching regulator. If the supply circuit 20 employs the boost-type switching regulator, the power supply circuit 20 consumes power even while the laser diode LD is not being driven. Therefore, it is necessary to delay start up of the power supply circuit 20 until just before the laser diode LD is driven, so as to reduce power consumption and save power.

However, if the power supply circuit 20 starts up slowly, it is necessary to make the power supply circuit 20 operate much earlier than a time the laser diode LD is driven, which causes a problem for high-speed operation of the laser diode LD. Consequently, it is necessary to raise the output voltage Vo of the power supply circuit 20 quickly up to a necessary voltage to light the laser diode LD.

BRIEF SUMMARY

This patent specification describes a novel laser diode drive circuit includes a power supply circuit connected to an anode of a laser diode to supply a variable voltage to the laser diode, and a drive current control circuit connected to a cathode of the laser diode to control a current of the laser diode. The power supply circuit generates a start-up voltage which is equal to the sum of the maximum drive voltage that is larger than the drive voltage and a predetermined first reference voltage, acquires a cathode voltage of the laser diode while the start-up voltage is generated, and generates a voltage by dropping from the start-up voltage so as to diminish the difference between the acquired cathode voltage and the first reference voltage. The first reference voltage is the minimum cathode voltage necessary to supply a predetermined current to the laser diode by the drive current control circuit.

This patent specification further describes a novel laser diode drive circuit to drive a plurality of laser diodes. The laser diode drive circuit includes multiple drive current control circuits that correspond to a respective one of the laser diodes and is connected to the cathode of the respective laser diode to control the current therefor, the power supply circuit connected to anodes of the respective laser diodes, and a selection circuit to select one of the cathode voltages of the laser diodes. The power supply circuit acquires the cathode voltage selected by the selection circuit to change the output voltage of the power supply circuit based on the acquired cathode voltage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
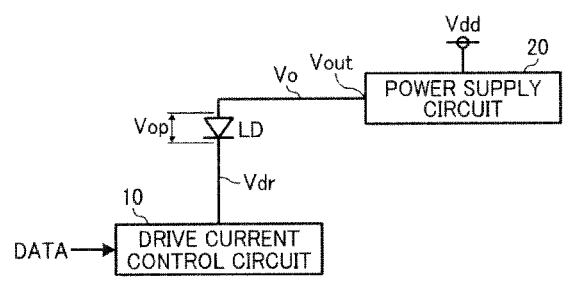
FIG. 1 is a circuit diagram of a known laser diode drive circuit.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 2:
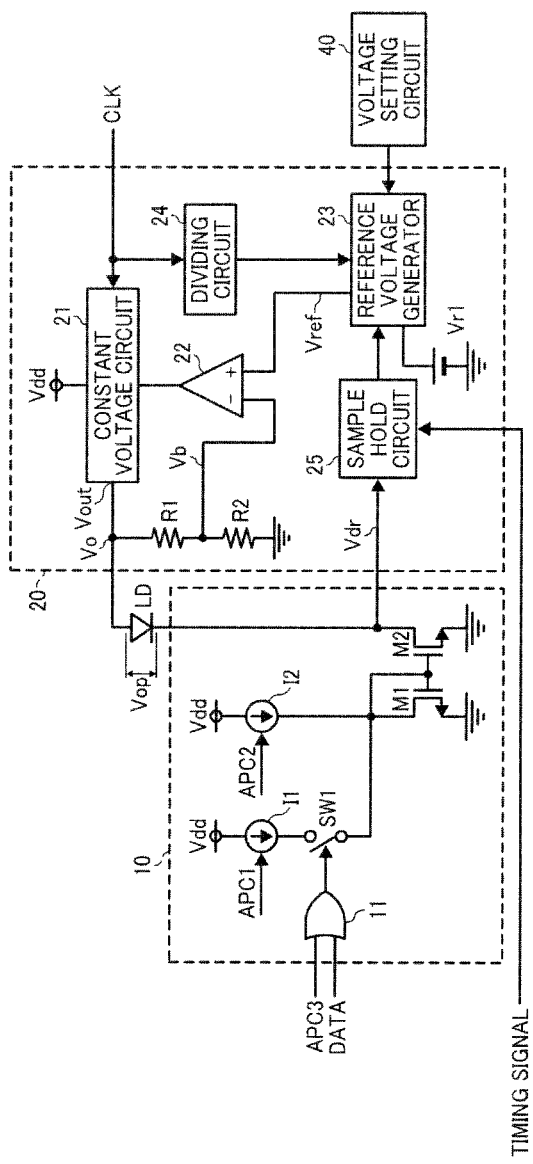
FIG. 2 is a circuit diagram of a laser diode drive circuit according to an illustrative first embodiment.

Referring now to the drawings, wherein like reference numerals designate identical or corresponding parts throughout the several views, particularly to FIG. 2, a laser diode drive circuit according to an illustrative embodiment is described.

First Embodiment

FIG. 2 is a circuit diagram of a laser diode drive circuit according to an illustrative first embodiment. The laser diode drive circuit includes a power supply circuit 20, a drive current control circuit 10, and a voltage setting circuit 40. The drive current control circuit 10 is connected to a cathode of the laser diode LD and controls a drive current flowing through the laser diode LD, and the power supply circuit 20 is connected to an anode of the laser diode LD and generates a voltage which is variable to apply it to the laser diode LD.

The drive current control circuit 10 includes an OR circuit 11, a switching current source I1, a bias current source I2, a switch SW1, and NMOS transistors M1 and M2. Automatic Power Control (APC) signals and image data signals DATA are input to the drive current control circuit 10. The APC signal includes an APC1 signal, an APC2 signal, and an APC3 signal in this embodiment, which are generated in a preprocessing circuit (refer to FIGS. 3 through 7).

In the drive current control circuit 10, the switching current source I1 and the bias current source I2 are connected to the Vdd power supply source. The switching current source I1 is connected to a drain of the NMOS transistor M1 through the switch SW1 whereas the bias current source I2 is directly connected to a drain of the NMOS transistor M1. A current of the switching current source I1 is a current to light the laser diode LD at a predetermined brightness, and is generally controlled to be a predetermined value by the APC 1 signal. The bias current source I2 is set to be a current that is slightly lower than the threshold current of the laser diode LD. The bias current source I2 is also controlled to be a predetermined value by the APC 2 signal.

As for the OR circuit 11, the APC3 signal is input to one input terminal and the image data signal DATA is input to the other input terminal. An output signal of the OR circuit 11 controls the switch SW1 to turn the switch SW1 on when either one of the APC3 signal and the image data signal DATA is a high level. A source of the NMOS transistor M1 is connected to ground GND, a gate of the NMOS transistor M1 is connected to the drain of the NMOS transistor M1 and a gate of the NMOS transistor M2. Further, a source of the NMOS transistor M2 is also connected to ground GND. Accordingly, the NMOS transistors M1 and M2 form a current mirror circuit. A drain of the NMOS transistor M2 is the LD output terminal of the drive current control circuit 10. A cathode of the laser diode LD is connected to the LD output terminal. The LD output terminal is connected to a sample-hold circuit of the power supply circuit 20, described later. Consequently, the drive current control circuit 10 having the circuit configuration described above sends a predetermined constant current through the laser diode LD.

The power supply circuit 20 includes a constant voltage circuit 21, an error amplifier 22, a reference voltage generator 23, a dividing circuit 24, a sample-hold circuit 25, bleeder resistors R1 and R2, and a first reference voltage source Vr1. A timing signal generated in the preprocessing circuit 1, a voltage of the LD output terminal (the LD output terminal voltage) Vdr, a predetermined clock signal CLK, and a voltage setting signal from the voltage setting circuit 40 are input to the power supply circuit 20. The LD output terminal voltage Vdr is a cathode voltage of the laser diode LD.

The constant voltage circuit 21 is formed of a switching regulator. The switching regulator is, for example, a boost-type switching regulator. To the constant voltage circuit 21, the clock signal CLK and an output signal of the error amplifier 22, described later, are input. The constant voltage circuit 21 is connected to the Vdd power supply source. Further, an output terminal Vout of the power supply circuit 20 is connected to an anode of the laser diode LD. An output voltage Vo is generated at the output terminal Vout to supply power to the laser diode LD. Accordingly, the output voltage Vo of the constant voltage circuit 21 is the output voltage of the power supply circuit 20.

The bleeder resistors R1 and R2 are connected in series between the output terminal Vout of the constant voltage circuit 21 and ground. At a junction node between the bleeder resistors R1 and R2, a dividing voltage Vb is generated by dividing the output voltage Vo of the constant voltage circuit 21, the dividing voltage Vb is input to an inverting input terminal of the error amplifier 22. A reference voltage Vref generated by the reference voltage generator 23, described later, is input to a non-inverting input terminal of the error amplifier 22. The error amplifier 22 outputs a difference voltage between the dividing voltage Vb and the reference voltage Vref to the constant voltage circuit 21. The constant voltage circuit 21 controls the output voltage Vo so that the difference voltage becomes 0 volt. Since the LD output terminal is connected to an input terminal of the sample-hold circuit 25, the LD output terminal voltage Vdr is input to the sample-hold circuit 25. Further, a timing signal, described later, is input to a control signal input terminal of the sample-hold circuit 25 to control operation of the sample-hold circuit 25.

The sample-hold circuit 25 stores the LD output terminal voltage Vdr by sampling it, and outputs it to the reference voltage generator 23 by digitalizing it. The output voltage from the sample-hold circuit 25, a predetermined reference voltage Vr1, and a voltage setting signal generated by a voltage setting circuit 40 are input to the reference voltage generator 23. The reference voltage generator 23 generates a reference voltage Vref by a procedure described later for input to the non-inverting input terminal of the error amplifier 22. The first reference voltage Vr1 is equal to a minimum drain voltage of the NMOS transistor M2 which is necessary to supply a predetermined constant current set by the drive current control circuit 10 to the laser diode LD, i.e., the minimum voltage necessary for the LD output terminal voltage Vdr, and is supplied from, for example, a predetermined voltage source to the reference voltage generator 23. Further, a partial clock signal generated by dividing a clock signal CLK by the frequency divider 24 is input to the reference voltage generator 23 so as to cause a DA converter in the reference voltage generator 23, not shown, to operate.

The voltage setting circuit 40 sends a voltage setting signal to reference voltage generator 23 to set the output voltage Vo of the constant voltage circuit 21 to an initial setting voltage before starting to drive the laser diode LD. The voltage setting signal includes information on the maximum drive voltage Vopmax of the laser diode LD to be used, and a constant, N=(R1+R2)/R2, which is determined by a ratio of the bleeder resistors R1 and R2. To generate the first reference voltage source Vr1, it is not necessary to provide an actual voltage source device in the power supply circuit 20. However the value may be held in the reference voltage generator 23 by inputting and holding digital data. Further, the voltage setting signal may include the information on the first reference voltage source Vr1.

Referring to FIGS. 3 through 7, a description is given of the timing signal is used to control operation of the sample-hold circuit 25.

Figure 3:
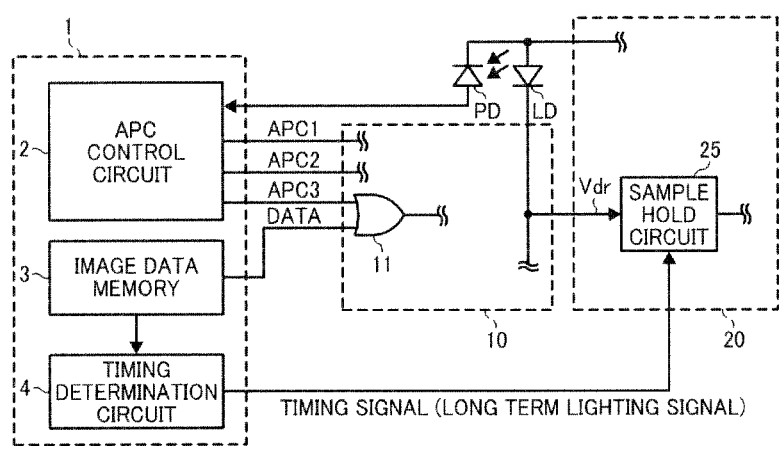
FIG. 3 is a block diagram that represents a configuration when the timing signal is a long term lighting signal.

FIG. 3 is a block diagram that represents a configuration when the timing signal is a long term lighting signal. It is a feature of the configuration of FIG. 3 that the timing signals are generated externally, outside of the laser diode drive circuit. As shown in FIG. 3, a pre-processing circuit 1 is provided at the former stage of the laser diode drive circuit. The pre-processing circuit 1 includes an APC control circuit 2, an image data memory 3, and a timing determination circuit 4. To perform automatic power control (APC), a photo diode PD is closely provided to the laser diode LD. The photo diode PD generates a signal indicating a light intensity of the laser diode LD, and sends it to the APC control circuit 2. The APC control circuit 2 generates APC signals including APC 1 signal, APC 2 signal, and APC 3 signal, which control the light intensity of the laser diode LD based on the signal from the photo diode PD, and sends them to the drive current control circuit 10. The image data memory 3 stores image data processed by an image processing processor, not shown, and sends the image data signal DATA including stored image data to the drive current control circuit 10.

The timing determination circuit 4 determines a term length of a high level during which the image data signal DATA being sent to the drive current control circuit 10 is kept in a high level successively. In other words, the term length is a length of time during which the laser diode kept lighted. If the term length is longer than a predetermined time period (acquisition time), the timing determination circuit 4 sends a long term lighting signal as a timing signal to the power supply circuit 20 in synchronization with the image data signal DATA. The acquisition time is a time necessary for the sample-hold circuit 25 to perform sampling on the LD output terminal voltage Vdr for storage. More specifically, it is a time that the voltage after change converges within a predetermined range when the LD output terminal voltage Vdr changes from the possible minimum value to the maximum value (or vice versa) during the sampling operation.

Figure 4:
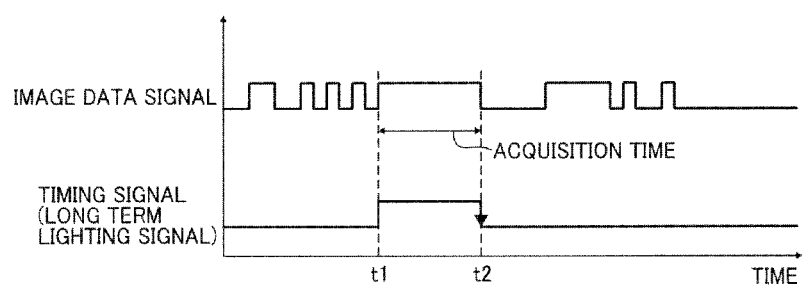
FIG. 4 is a timing chart representing examples of the image data signal DATA and the timing signal in the laser diode drive circuit of FIG. 3.

FIG. 4 is a timing chart representing an example of the image data signal DATA and the timing signal in the laser diode drive circuit of FIG. 3.

The sample-hold circuit 25 starts to perform sampling on the LD output terminal voltage Vdr at a signal edge (t1) when the long term lighting signal changes from a low level to a high level, and starts to perform analog to digital (AD) conversion for the LD output terminal voltage Vdr that is processed by performing the sampling operation at a signal edge (t2) when the long term lighting signal changes from a high level to a low level.

If the successive high level term of the image data signal DATA is shorter than the acquisition time, it is not possible to perform sampling on the LD output terminal voltage Vdr and store it because the light-on time of the laser diode is too short. Accordingly, in this case, the sampling operation on the LD output terminal voltage Vdr and storing operation are not performed. Consequently, the output voltage Vo of the power supply circuit 20 is not changed. The power supply circuit 20 acquires the LD output terminal voltage Vdr so as to change the output voltage Vo of the power supply circuit 20 only when the long term lighting signal is input to the sample-hold circuit 25.

Figure 5:
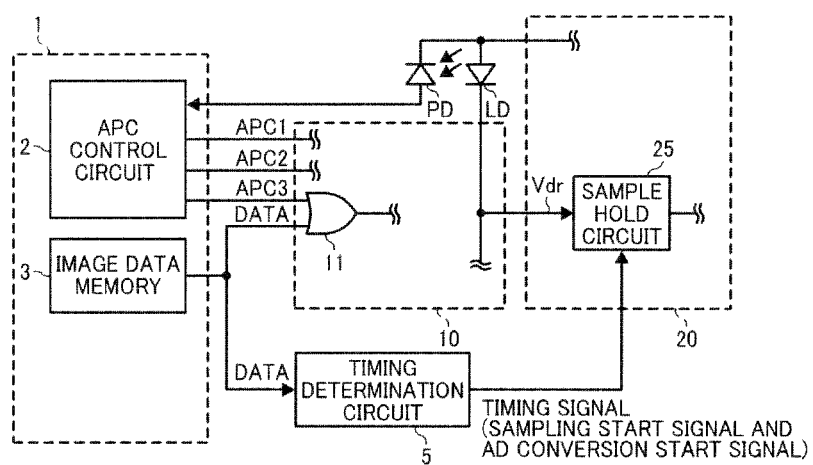
FIG. 5 is a block diagram represents a configuration when the timing signal is the sampling start signal and AD conversion signal.

FIG. 5 is a block diagram representing a configuration when the timing signal is a sampling start signal and an AD conversion start signal. It is a feature of the configuration shown in FIG. 5 that the pre-processing circuit 1 does not include the timing determination circuit 4 to generate the timing signal. Instead, the laser diode drive circuit generates the timing signal based on the image data signal DATA. Accordingly, the laser diode drive circuit includes a timing determination circuit 5 replacing the timing determination circuit 4 in the pre-processing circuit 1 of FIG. 3. The image data signal DATA including the image data stored in the image data memory 3 is transmitted to the drive current control circuit 10 and to the timing determination circuit 5 at the same time. When the image data signal DATA becomes a high level from a low level, the timing determination circuit 5 sends the sampling start signal to the sample-hold circuit 25 in the power supply circuit 20. Further, the timing determination circuit 5 determines a term length of the successive high level term of the image data signal DATA. If the above term length is longer than the acquisition time, the AD conversion start signal is sent as a timing signal to the sample-hold circuit 25 in the power supply circuit 20 in synchronization with the image data signal DATA at a time when the successive high level term of the image data signal DATA exceeds the acquisition time.

Figure 6:
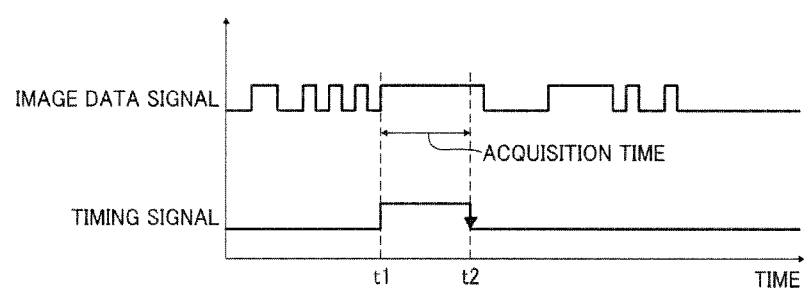
FIG. 6 is a timing chart representing the image data signal DATA and the timing signal in the laser diode drive circuit of FIG. 5.

FIG. 6 is a timing chart representing the image data signal DATA and the timing signal in the laser diode drive circuit of FIG. 5. To compare with FIG. 4, in FIG. 6, the sampling start signal is represented by a signal edge (time t1) that the timing signal changes from a low level to a high level, and the AD conversion start signal is represented by a signal edge (time t2) that the timing signal changes from a high level to a low level. The sample-hold circuit 25 starts to perform sampling on the LD output terminal voltage Vdr when the sampling start signal is input, and starts to perform AD conversion on the LD output terminal voltage Vdr that is processed by performing the sampling operation when the AD conversion start signal is input.

Figure 7:
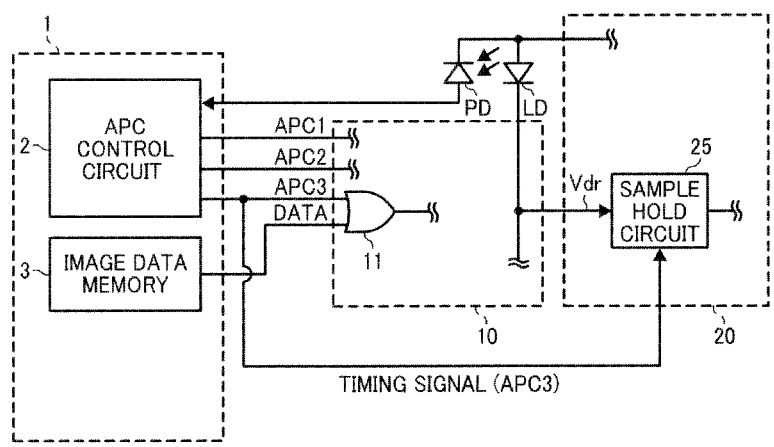
FIG. 7 is a block diagram represents a configuration of the laser diode drive circuit of FIG. 2 when the timing signal is an APC3 signal.

FIG. 7 is a block diagram representing a configuration of the laser diode drive circuit of FIG. 2 when the timing signal is the APC3 signal. The timing signals of FIGS. 3 through 6 are signals to light the laser diode LD for more than a predetermined time period. However, the APC signal may be employed as the timing signal replacing such signals. In the configuration of FIG. 7, the APC 3 signal that is input to the OR circuit 11 is also sent to the sample-hold circuit 25. The APC 3 signal is set to keep a high level successively for a period longer than an acquisition time. More specifically, it is set to light the laser diode successively.

The sample-hold circuit 25 starts to perform sampling on the LD output terminal voltage Vdr at a signal edge when the APC 3 signal changes from a low level to a high level, and starts to perform AD conversion for the LD output terminal voltage Vdr that is processed by performing the sampling operation at a signal edge when the APC 3 signal changes from a high level to a low level.

The power supply circuit 20 acquires the LD output terminal voltage Vdr to change the output voltage Vo of the power supply circuit 20 only when the APC 3 signal is input to the sample-hold circuit 25.

The timing signals of FIGS. 3 through 7 described above may be combined. For example, in a case in which the signal of FIG. 3 is combined with the signal of FIG. 7, it may perform sampling on the LD output terminal voltage Vdr and store it when at least one of the long term lighting signal and the APC 3 signal is input to the sample-hold circuit 25.

Operation of the laser diode drive circuit of FIG. 2 is now described.

In the laser diode drive circuit according to the illustrative first embodiment, the power supply circuit 20 generates an initial voltage Vo_init that is equal to the sum of the maximum drive voltage Vopmax that is larger than the drive voltage of the laser diode and the first reference voltage Vr1. The power supply circuit 20 acquires the LD output terminal voltage Vdr while the power supply circuit 20 generates an initial voltage Vo_init. The power supply circuit 20 generates a voltage that is lower than the initial voltage Vo_init so as to diminish the difference between the acquired LD output terminal voltage Vdr of the laser diode and the first reference voltage Vr1.

The reference voltage generator 23 determines the initial voltage of the reference voltage Vo_init based on the voltage setting signal input from the voltage setting circuit 40, and inputs it to the non-inverting terminal of the error amplifier 22.

The initial voltage, serving as a start-up voltage, of the reference voltage Vo_init is determined so that the initial voltage of the reference voltage Vo_init is equal to the sum of an initial value of the maximum drive voltage of the laser diode Vopmax and the first reference voltage. Thus, at the beginning, the laser diode drive circuit sets a higher voltage as the start-up voltage with which any laser diode having a variety of drive voltages Vop can be reliably lighted. Consequently, it is possible to raise the output voltage of the power supply circuit 20 quickly.

The NMOS transistors M1 and M2 form a current mirror circuit. A bias current is constantly supplied from the bias current source I2 to the NMOS transistor M1. Accordingly, when the output voltage of the power supply circuit 20 Vo_init is applied, a current equal to the current of the bias current source I2 flows through the laser diode LD. However, the laser diode LD may not be lighted because the current of the bias current source I2 is lower than the threshold current of the laser diode LD. After that, the APC 3 signal is input to the OR circuit 11 of the drive current control circuit 10. Then, the switch SW1 is turned on. As a result, a current of the switching current source I1 is added to the current of the bias current source I2 so as to turn the laser diode LD on. At this time, the sample-hold circuit 25 converts the LD output terminal voltage Vdr, which is a drain voltage of the NMOS transistor M2, to a digital signal by performing sampling on the LD output terminal voltage Vdr, and sends the converted LD output terminal voltage Vdr to the reference voltage generator 23. The reference voltage generator 23 generates a difference voltage by subtracting the first reference voltage Vr1 from the LD output terminal voltage Vdr input from the sample-hold circuit 25. Further, the reference voltage generator 23 generates a difference voltage signal by dividing the difference voltage by a constant, $N=(R1+R2)/R2=Vo/Vb$, which is determined by a ratio of the resistances of the bleeder resistors. Then, the reference voltage generator 23 subtracts the difference voltage signal from the initial voltage Vref_init of the reference voltage, and outputs the result as a reference voltage Vref.

The above operation will now be described using the following formulae.

At first, the initial voltage Vo_init of the reference voltage is expressed as $$Vref\_init = (Vopmax + Vr1)/N \qquad (1).$$

While the initial voltage of the reference voltage Vref_init is being set, the output voltage of the power supply circuit 20 is Nth-fold voltage of the reference voltage. Accordingly, the initial voltage of the output voltage is expressed as $$Vo\_init = Vopmax + Vr1.$$

When the first reference voltage Vr1 is subtracted from the LD output terminal voltage Vdr input from the sample-hold circuit 25, the difference voltage $\Delta V$ is expressed as $$\Delta V = Vdr\_init - Vr1 \qquad (2)$$

The difference voltage $\Delta V$ is divided by a constant N, $$\Delta V/N = (Vdr\_init - Vr1)/N \qquad (3)$$

When a voltage obtained by subtracting the formula (3) from the formula (1) is defined as the final reference voltage Vref, $$Vref = (Vopmax + Vr1 - Vdr\_init + Vr1)/N \qquad (4)$$

While the initial voltage of the reference voltage Vref_init is being set, the initial voltage of the LD terminal voltage Vdr_init is a voltage obtained by subtracting the drive voltage Vop of the laser diode LD from the initial voltage Vo_init of the output voltage.

$$Vdr\_init = Vo\_init - Vop = Vopmax + Vr1 - Vop \qquad (5)$$

By substituting the formula (5) into the formula (4), we find that $$Vref = (Vopmax + Vr1 - Vopmax - Vr1 + Vop + Vr1)/N \qquad (6)$$
$$= (Vop + Vr1)/N$$

Since the output voltage Vo is Nth-fold voltage of the reference voltage Vref, the output voltage Vo when the reference voltage of the formula (4) is being set is expressed as $$Vo = Vop + Vr1 \qquad (7)$$

Consequently, by setting the reference voltage using formula (4), it is possible to control the output voltage so that the output voltage becomes a voltage which is the sum of the drive voltage Vop of the laser diode LD and the first reference voltage Vr1.

In this case, the output voltage Vo obtained by setting the reference voltage Vref using formula (4) does not include errors, for example, an error generated during the AD conversion at the sample-hold circuit 25, and errors due to variations of the minimum value of the LD output terminal voltage Vdr. For this reason, some reference voltage Vref may be added to the right-hand side of the formula (7) so as to add an offset voltage. For example, a voltage Vα is added as an offset voltage to the first reference voltage Vr1 so as to have some margin.

As described above, according to the laser diode drive circuit of the present disclosure, the output voltage Vo of the power supply circuit 20 is set initially to a higher voltage that is the sum of an initial value of the maximum drive voltage of the laser diode Vopmax and the first reference voltage. Accordingly, it is possible to speed up start-up of the power supply circuit 20. After the starting-up of the power supply circuit 20, the output voltage Vo of the power supply circuit 20 is controlled to become a voltage which is the sum of the drive voltage Vop of the laser diode LD currently connected and the first reference voltage Vr1 that is the minimum LD terminal voltage. Consequently, it becomes possible to reduce power consumption by not using unnecessary voltage for driving the laser diode. Further, since the APC signal and the long term lighting signal are used to change the reference voltage Vref so that the output voltage Vo is altered flexibly, it becomes possible to maintain the output voltage Vo of the power supply circuit 20 constantly at a suitable drive voltage even when the drive voltage Vop of the laser diode LD changes due to, for example, temperature change.

Second Embodiment

Figure 8:
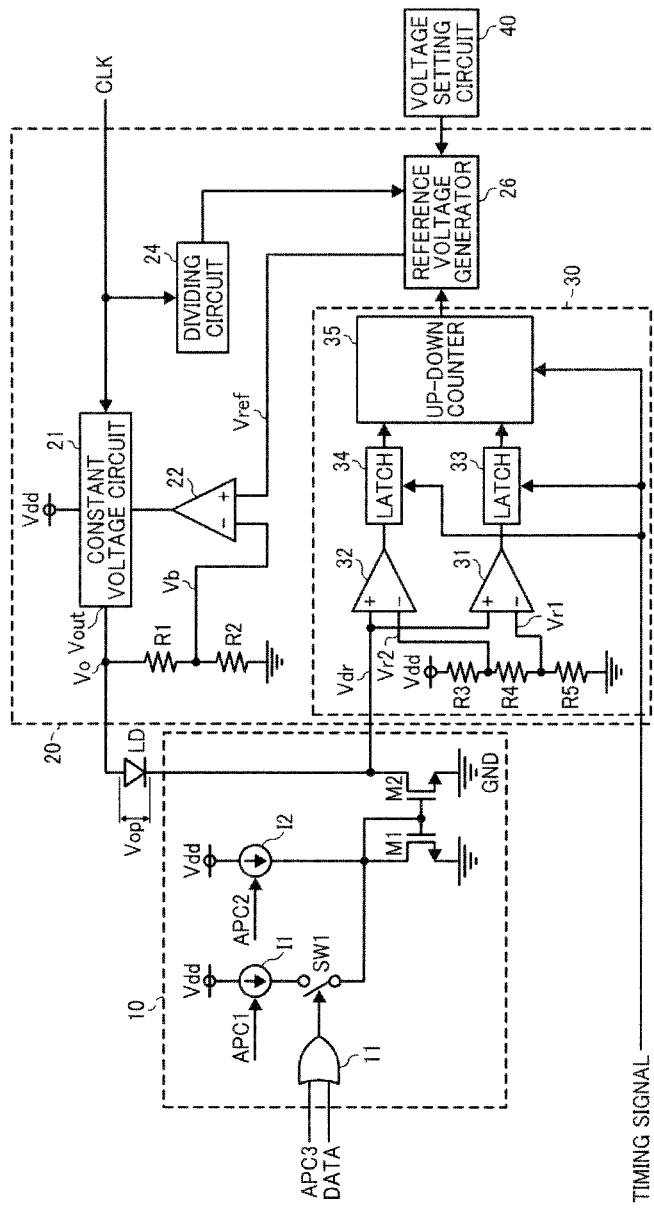
FIG. 8 is a schematic block diagram of a laser diode drive circuit according to an illustrative second embodiment.

FIG. 8 is a schematic block diagram of a laser diode drive circuit according to a second embodiment. The laser diode drive circuit includes a drive current control circuit 10, a power supply circuit 20, and a voltage setting circuit 40. The laser diode drive circuit includes a voltage difference detector 30 replacing the sample-hold circuit 25 in the first embodiment. Further, the first reference voltage source to generate the first reference voltage Vr1 is included in the voltage difference detector 30. Further, the laser diode drive circuit includes a reference voltage generator 26 replacing the reference voltage generator 23 in the first embodiment to refer an output signal of the voltage difference detector 30. The other components of the laser diode drive circuit according to the second embodiment are the same as those of the laser diode drive circuit according to the first. Accordingly, only the difference will be described.

The voltage difference detector 30 includes a first comparator 31, a second comparator 32, a latch 33 that is a first storage, a latch 34 that is a second storage, an up-down counter 35, and bleeder resistors R3, R4, and R5.

In the voltage difference detector 30, the bleeder resistors R3, R4, and R5 are connected in series between the Vdd voltage source and ground (GND). A first reference voltage Vr1 is generated at a junction node between the bleeder resistors R3 and R4. A second reference voltage Vr2 is generated at a junction node between the bleeder resistors R4 and R5.

The first reference voltage Vr1 is a voltage equal to the first reference voltage in the first embodiment. The second reference voltage Vr2 is set to a high voltage that is slightly higher than the first reference voltage Vr1.

The LD output terminal voltage Vdr is input to non-inverting input terminals of the comparators 31 and 32. The first reference voltage Vr1 is input to an inverting input terminal of the comparator 31. The second reference voltage Vr2 is input to an inverting input terminal of the comparator 32. The comparator 31 determines whether the LD output terminal voltage Vdr is equal to and lower than the first reference voltage Vr1 by comparing the two voltages. Further, the comparator 32 determines whether the LD output terminal voltage Vdr is higher than the second reference voltage Vr2 by comparing the two. An output signal from the comparator 31 is input to the latch 33 that is the first storage. An output signal from the comparator 32 is input to the latch 34 that is the second storage. The output signals from the latches 31 and 32 are input to the up-down counter 35. A timing signal is input to each control input terminal of the latches 33 and 34 and a control input of the up-down counter 35 to control the operation thereof. The timing signal of this embodiment must have a duration which is more than the sum of the time for the comparators 31 and 32 to operate and the time for the latches 33 and 34 to operate.

Similarly to the first embodiment, the timing signal of this embodiment may be a combination of any timing signal of FIGS. 3 through 7. The latches 33 and 34 store the signal input from the comparators 31 and 32 in synchronization with the timing signal.

The up-down counter 35 performs counting operation at a signal edge (end edge) when the timing signal changes from a high level to a low level. When the output signal of the latch 33 is a high level, i.e., the comparator 31 determines that the LD output terminal voltage Vdr is equal to and lower than the first reference voltage Vr1, the up-down counter 35 performs up-counting operation. When the output signal of the latch 34 is a low level, i.e., the comparator 32 determines that the LD output terminal voltage Vdr is higher than the second reference voltage Vr2, the up-down counter 35 performs down-counting operation. Further, when the output signal of the latch 33 is a low level and the output signal of the latch 34 is a high level, the up-down counter 35 holds the output value without changing the counting value. In this embodiment, the up-down counter 35 performs counting by "+1" or "−1" at every end edge of the timing signal. However, the counting step number is not limited to these single number increments/decrements, and alternatively multi-number increments/decrements may be employed. Further, the counting step number may be changed according to a duration of the high level of the timing signal.

The output signal of the up-down counter 35, i.e, a count value, is input to the reference voltage generator 26.

In the reference voltage generator 26, the count value is set to a predetermined corresponding voltage change value. The reference voltage generator 26 sets the initial value of the reference voltage Vref_init based on the voltage setting signal input from the voltage setting circuit 40 and inputs it to a non-inverting input terminal of the error amplifier 22. Then, the reference voltage generator 26 inputs a voltage to the non-inverting input terminal of the error amplifier 22 as a reference voltage Vref by subtracting the voltage change value corresponding to counting value from the set initial value of the reference voltage Vref_init. As a result, it is possible to increase voltage value to drop when the counting value is large, and it is possible to decrease the voltage value to drop when the counting value is small.

Now, operation of the laser diode drive circuit of FIG. 8 is described.

The reference voltage generator 26 sets the initial value of the reference voltage Vref_init based on the voltage setting signal input from the voltage setting circuit 40 to input it to the non-inverting input terminal of the error amplifier 22. The initial value of the reference voltage Vref_init is set to a voltage that is the sum of the maximum drive voltage of the laser diode Vopmax and the first reference voltage. When the output voltage of the power supply circuit 20 starts to apply the output voltage Vo_init, a current equal to the current of the bias current source I2 flows through the laser diode LD.

After that, the APC 3 signal is input to the OR circuit 11 of the drive current control circuit 10. Then, the switch SW1 is turned on. As a result, a current of the switching current source I1 is added so as to turn the laser diode LD on. At this time, the first comparator 31 outputs the comparison result between the LD terminal voltage Vdr and the first reference voltage Vr1 and the second comparator 32 outputs the comparison result between the LD terminal voltage Vdr and the second reference voltage Vr2.

These comparison results are stored in the latches 33 and 34. When the LD output terminal voltage Vdr is higher than the second reference voltage Vr2, the comparator 32 outputs a high level so that the latch 34 outputs a high level. Accordingly, the up-down counter 35 performs up-counting operation to increase the counting value. Further, the reference voltage generator 26 generates a voltage by subtracting the voltage change value corresponding to counting value from the initial value of the reference voltage Vref_init as a reference voltage Vref. Accordingly, the reference voltage Vref becomes a voltage lower than the initial value of the reference voltage Vref_init. When the reference voltage Vref becomes a lower value, the output voltage Vo and the LD output terminal voltage Vdr is decreased.

When the LD output terminal voltage Vdr is lower than the second reference voltage Vr2 and is higher than the first reference voltage Vr1, the comparator 32 outputs a low level, and the comparator 31 outputs a high level. At this time, the up-down counter 35 stops the counting operation and holds the counting value. In this condition, the reference voltage Vref becomes stable.

However, when the LD output terminal voltage Vdr is lower than the first reference voltage Vr1, for example, by setting the reference voltage Vref excessively low or by a change in the drive voltage Vop of the laser diode LD due to temperature change, the comparator 31 outputs a low level. In this condition, the up-down counter 35 performs the down-counting operation to decrease the counting value. Accordingly, the reference voltage Vref is increased so that the output voltage Vo and the LD output terminal voltage Vdr are increased.

When the LD output terminal voltage Vdr is higher than the first reference voltage Vr1 and is lower than the second reference voltage Vr2, the comparator 31 outputs a high level, the comparator 32 outputs a low level. Consequently, the up-down counter 35 stops the counting operation and holds the counting value. In this condition, the reference voltage Vref becomes stable.

As described above, the laser diode drive circuit according to the second embodiment can reduce power consumption similarly to the first embodiment. Further, it is possible to speed up raising the output voltage of the power supply circuit 20. Furthermore, in the laser diode drive circuit according to the second embodiment, the LD terminal voltage Vdr is controlled to stay at a voltage which is between the first reference voltage Vr1 and a second reference voltage that is slightly higher than the first reference voltage Vr1, i.e., within a range between the first reference voltage Vr1 that is the minimum value and the second reference voltage Vr2 that is the maximum value.

As a result, it becomes possible to reduce power consumption of the drive current control circuit 10.

Third Embodiment

Figure 9:
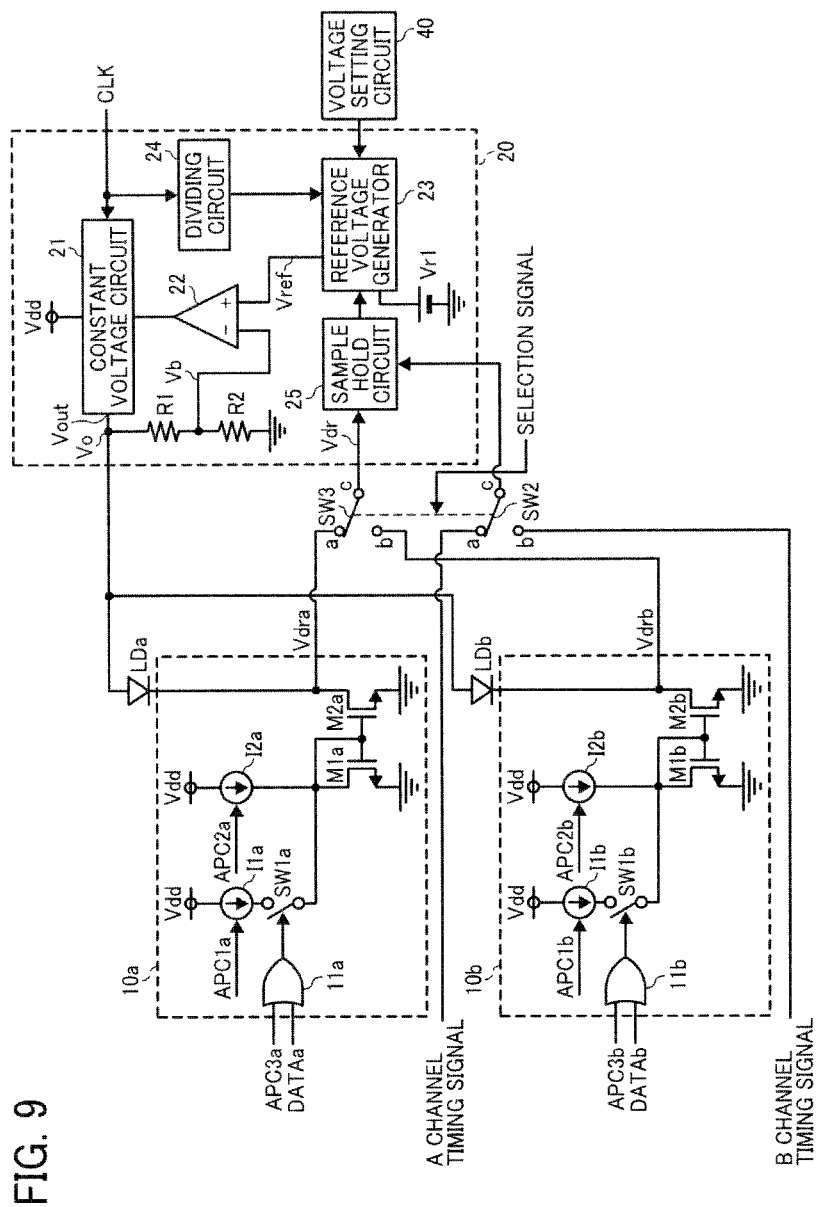
FIG. 9 is a schematic block diagram of a laser diode drive circuit according to an illustrative third embodiment.

FIG. 9 is a schematic block diagram of a laser diode drive circuit according to a third embodiment.

In the first and second embodiments, a single laser diode is driven. However, the number of laser diodes to be driven is not limited to one. Thus, in the third embodiment, two laser diodes LDa and LDb are driven. The laser diode drive circuit here includes a drive current control circuit 10a to drive the laser diode LDa and a drive current control circuit 10b to drive the laser diode LDb. The basic configuration of the laser diode drive circuit according to the third embodiment is otherwise the same as that of the laser diode drive circuit according to the first. Accordingly, only the difference will be described.

In the configuration of FIG. 9, hereinafter, the part to drive the laser diode LDa is defined as an A channel, and the part to drive the laser diode LDb is defined as a B channel. The APC signal (including APC1, APC2, and APC3) and the image data signal DATAa are input to the drive current control circuit 10a for the A channel. A timing signal for A channel is input to the power supply circuit 20 through a switch SW2. A voltage of an LD output terminal of the drive current control circuit 10a (LD output terminal voltage of the A channel) Vdra is input through a switch SW3.

The APC signal (including APC1, APC2, and APC3) and the image data signal DATAb are input to the drive current control circuit 10b for the B channel. A timing signal for B channel is input to the power supply circuit 20 through a switch SW2. A voltage of an LD output terminal of the drive current control circuit 10b (LD output terminal voltage of the B channel) Vdrb is input through a switch SW3.

Each anode of the laser diode LDa and LDb is connected to the power supply circuit 20. Each cathode of the laser diode LDa and LDb is connected to the corresponding drive current control circuit 10a, 10b.

The configuration of the drive current control circuit 10a, 10b is similar to that of the drive current control circuit 10 of FIG. 2. The switch SW2 sends one of the timing signal for the A channel and the timing signal for the B channel to the control input terminal of the sample-hold circuit 25 to control the sample-hold circuit 25. The switch SW3 sends one of the LD terminal voltage of the A channel Vdra and the LD terminal voltage of the B channel Vdrb to the input terminal of the sample-hold circuit 25. The switches SW2 and SW3 connect the A channel and the B channel according to an external selection signal in conjunction with each other. The selection signal is supplied from a control circuit provided externally (for example, a CPU, not shown).

If the channel to be selected is fixed when the laser diodes LDa and LDb are connected, the connection may be fixed with the A channel or the B channel by using either Vdd power supply voltage or ground instead of the switches.

When the switches SW2 and SW3 connect the A channel systems, the power supply circuit 20 controls the output voltage Vo of the power supply circuit 20 so that the LD terminal voltage of the A channel Vdra becomes equal to or higher than first reference voltage source Vr1. When the switches SW2 and SW3 connect the B channel systems, the power supply circuit 20 controls the output voltage Vo of the power supply circuit 20 so that the LD terminal voltage of the B channel Vdrb becomes equal to or higher than first reference voltage source Vr1.

As for which channel the switches SW2 or SW3 should select, the channel that is for a higher drive voltage may be selected. As a result, it is possible to supply enough of the drive current to the both laser diodes LDa and LDb. If the switches SW2 and SW3 select a channel which is for a lower drive voltage Vop, the LD terminal voltage Vdr of the laser diode that has a higher drive voltage Vop is lower than the first reference voltage Vr1 and the drive current may not be enough for the laser diode to light.

Although the laser diode drive circuit according to the third embodiment described above is for a system that employs two laser diodes, it is equally applicable to a system that employs more than two laser diodes. For such a case, the laser diode drive circuit includes two multiplexers replacing switches SW2 and SW3 of FIG. 9. The one multiplexer sends one of a plurality of timing signals to the control input terminal of the sample-hold circuit 25. The other multiplexer sends one of the LD terminal voltages of a plurality of channels to the input terminal of the sample-hold circuit 25. The multiplexers may be controlled according to the selection signal.

Moreover, the second and third embodiments may be combined. In such a case, the laser diode drive circuit includes the power supply circuit of FIG. 8, replacing the power supply circuit of FIG. 9.

As described above, similarly to the first and second embodiments, the laser diode drive circuit according to the third embodiment can reduce power consumption even when the laser diode drive circuit drives more than two laser diodes. Further, it is possible to raise the output voltage of the power supply circuit quickly.

Fourth Embodiment

Figure 10:
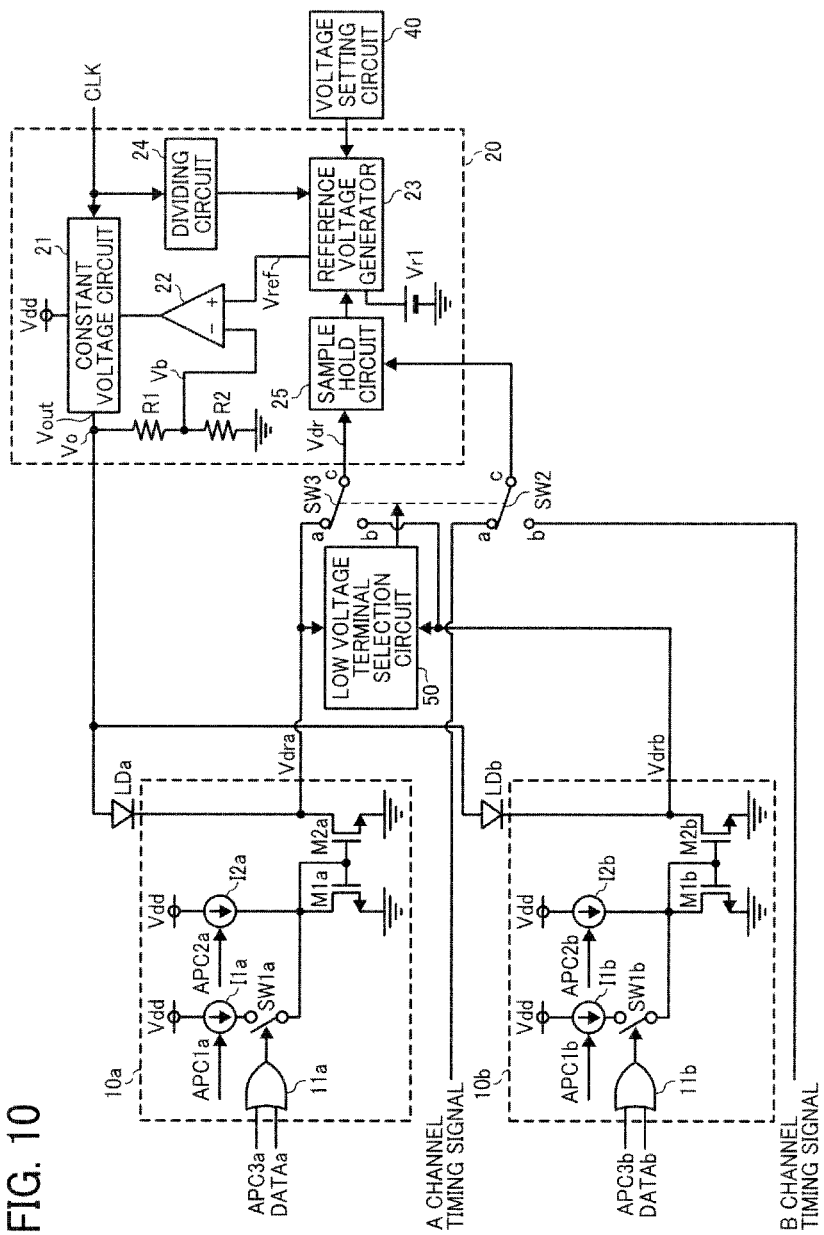
FIG. 10 is a schematic block diagram of a laser diode drive circuit according to an illustrative fourth embodiment.

FIG. 10 is schematic block diagram of a laser diode drive circuit according to a fourth embodiment. The laser diode drive circuit includes a low voltage terminal selection circuit 50 in addition to the circuit configuration of the laser diode drive circuit of the third embodiment to generate the selection signal of the third embodiment. The LD terminal voltage of the A channel Vdra and the LD terminal voltage of the B channel Vdrb are input to the low voltage terminal selection circuit 50. The low voltage terminal selection circuit 50 outputs a selection signal to select a channel corresponding to the lower of the two LD terminal voltages to control the switches SW2 and SW3. Accordingly, the lower LD terminal voltage is always input to the sample-hold circuit 25. Consequently, it becomes possible to adjust the output voltage Vo of the power supply circuit for the necessary drive voltage for the laser diode having a higher drive voltage Vop. In this embodiment, similarly to the third embodiment, the laser diode drive circuit according to the forth embodiment can be adopted even when more than two laser diodes are driven.

As described above, similarly to the first, second, and third embodiments, the laser diode drive circuit according to the fourth embodiment can reduce power consumption while driving the laser diodes. Further, it is possible to raise the output voltage of the power supply circuit quickly.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-202473 filed on Sep. 2, 2009 in the Japanese Patent Office, the entire contents of which are incorporated by reference herein.

What is claimed is:

1. A laser diode drive circuit, connected to a laser diode, comprising:
a timing determination circuit to generate a timing signal in synchronization with an image data signal based on a light intensity of the laser diode;
a power supply circuit connected to an anode of the laser diode and configured to receive the timing signal and supply a variable voltage to the laser diode,
the power supply circuit comprising a reference voltage generator to output a variable reference voltage;
a voltage setting circuit to generate a voltage setting signal to set the variable reference voltage; and
a drive current control circuit connected to a cathode of the laser diode and configured to control a current of the laser diode, wherein
the power supply circuit generates a start-up voltage which is equal to a sum of a maximum drive voltage of the laser diode and a predetermined first reference voltage, acquires a cathode voltage of the laser diode while the start-up voltage is generated, and generates the variable voltage which is less than the start up voltage and is controlled, based on the variable reference voltage output by the reference voltage generator and set in accordance with the voltage setting signal from the voltage setting circuit,
the first reference voltage being a minimum cathode voltage of the laser diode necessary to supply a predetermined current to the laser diode by the drive current control circuit,
wherein the timing signal generated by the timing determination circuit defines a time interval within which the cathode voltage of the laser diode, when changing from maxima to minima or from minima to maxima, converges within a predetermined range.

2. The laser diode drive circuit of claim 1, wherein the power supply circuit generates a voltage equal to or higher than a voltage that is obtained by subtracting from the start-up voltage a difference voltage that is the difference between the cathode voltage of the laser diode and the first reference voltage.

3. The laser diode drive circuit of claim 1, wherein the power supply circuit generates a voltage to apply to the laser diode so that the cathode voltage of the laser diode is within a predetermined voltage range.

4. The laser diode drive circuit of claim 3, wherein the minimum voltage of the voltage range is the first reference voltage.

5. The laser diode drive circuit of claim 1, wherein the power supply circuit includes:
a first comparator to determine whether the cathode voltage of the laser diode is equal to or lower than the first reference voltage;
a second comparator to determine whether the cathode voltage of the laser diode is higher than a second reference voltage which is higher than the first reference voltage; and
a counter to increase a counting value when the output signal of the first comparator is a high level, and to decrease the counting value when the output signal of the second comparator is a high level,
wherein a voltage amount of the output voltage of the power supply circuit to be dropped from the start-up voltage is determined according to the amount of the counting value.

6. The laser diode drive circuit of claim 1, wherein the power supply circuit acquires the cathode voltage of the laser diode to change the output voltage of the power supply circuit only when a signal indicating that the laser diode is lighted for more than a predetermined time period is input.

7. The laser diode drive circuit of claim 1, wherein the power supply circuit includes a switching regulator.

8. The laser diode drive circuit of claim 7, wherein the switching regulator is a boost-type switching regulator.

9. A laser diode drive circuit to drive a plurality of laser diodes, comprising:

a timing determination circuit to generate timing signals in synchronization with respective image data signals for the plurality of laser diodes, respectively, based on light intensity of the respective laser diodes;

a power supply circuit connected to anodes of the respective laser diodes and configured to receive the timing signals for the respective laser diodes and supply a variable output voltage to the laser diodes the power supply circuit comprising a reference voltage generator to output a variable reference voltage;

a voltage setting circuit to generate a voltage setting signal to set the variable reference voltage;

multiple drive current control circuits connected to respective cathodes of the respective laser diodes and configured to control respective currents of the laser diodes; and a selection circuit configured to select one of the cathode voltages of the respective laser diodes, wherein the power supply circuit generates a start-up voltage which is equal to a sum of a maximum drive voltage of the laser diode and a predetermined first reference voltage, acquires while the start-up voltage is generated the cathode voltage selected by the selection circuit, and generates the variable voltage which is less than the start up voltage and is controlled, based on the variable reference voltage output by the reference voltage generator and set in accordance with the voltage setting signal from the voltage setting circuit, wherein each of the timing signals generated by the timing determination circuit defines a time interval within which the cathode voltage of the corresponding laser diode, when changing from maxima to minima or from minima to maxima, converges within a predetermined range.

10. The laser diode drive circuit of claim 9, wherein the selection circuit selects a lowest cathode voltage among a plurality of cathode voltages of the plurality of laser diodes.

11. The laser diode drive circuit of claim 9, wherein the power supply circuit includes a switching regulator.

12. The laser diode drive circuit of claim 11, wherein the switching regulator is a boost-type switching regulator.

* * * * *